United States Patent [19]

Ikeda

[11] 4,320,530
[45] Mar. 16, 1982

[54] CHANNEL SELECTING APPARATUS EMPLOYING FREQUENCY SYNTHESIZER

[75] Inventor: Saburo Ikeda, Higashiosaka, Japan

[73] Assignee: Sanyo Electric Co., Ltd., Osaka, Japan

[21] Appl. No.: 92,669

[22] Filed: Nov. 9, 1979

[30] Foreign Application Priority Data

Nov. 15, 1978 [JP] Japan ................................ 53-142091

[51] Int. Cl.$^3$ .............................................. H04B 1/16
[52] U.S. Cl. .................................... 455/182; 455/183; 331/1 A; 331/DIG. 2
[58] Field of Search ............... 455/165, 182, 183, 260, 455/265, 264; 358/191.1, 193.1; 331/1 A, 17, 18, 25, DIG. 2

[56] References Cited

U.S. PATENT DOCUMENTS

| | | | |
|---|---|---|---|
| 3,821,650 | 6/1974 | Kase et al. | 455/182 |
| 3,949,305 | 4/1976 | McClaskey et al. | 331/1 A |
| 4,023,116 | 5/1977 | Alfke et al. | 455/260 |
| 4,031,549 | 6/1977 | Rast et al. | 455/182 |
| 4,034,310 | 7/1977 | Coe | 331/1 A |
| 4,218,657 | 8/1980 | Rast | 455/182 |

Primary Examiner—Jin F. Ng

Attorney, Agent, or Firm—Armstrong, Nikaido, Marmelstein & Kubovcik

[57] ABSTRACT

A tuner comprises a local oscillator including a variable capacitance diode. The output signal of the local oscillator is frequency divided by a prescaler and the frequency divided output is applied to a phase locked loop. The phase locked loop is structured such that the phases of the output signal of the prescaler and a reference frequency signal are compared and the signal associated with the phase difference is smoothed by a low pass filter and the smoothed output is applied to the variable capacitance diode as a tuning voltage. The low pass filter includes a smoothing capacitor. A tuning unlocked state is detected when the terminal voltage of the smoothing capacitor is stabilized at the source voltage or is stabilized at 0V. Upon detection of the tuning unlocked state, the tuning voltage applied to the variable capacitance diode is increased (when the smoothing capacitor is stabilized at the source voltage) or decreased (when the smoothing capacitor is stabilized at 0V), thereby to forcibly return to a lockable region. Thereafter a locked state or a normal reception state is established by a normal operation of the phase locked loop.

5 Claims, 9 Drawing Figures

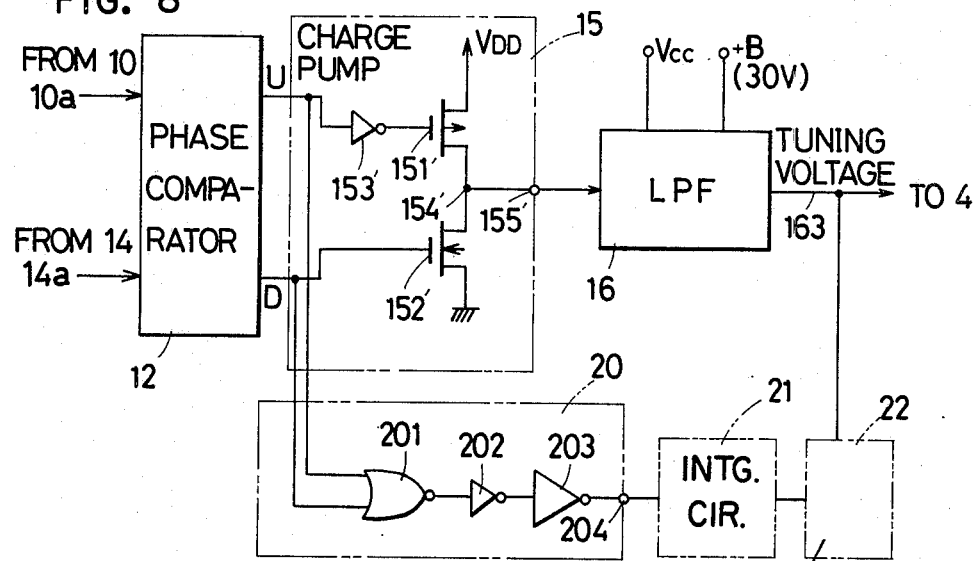
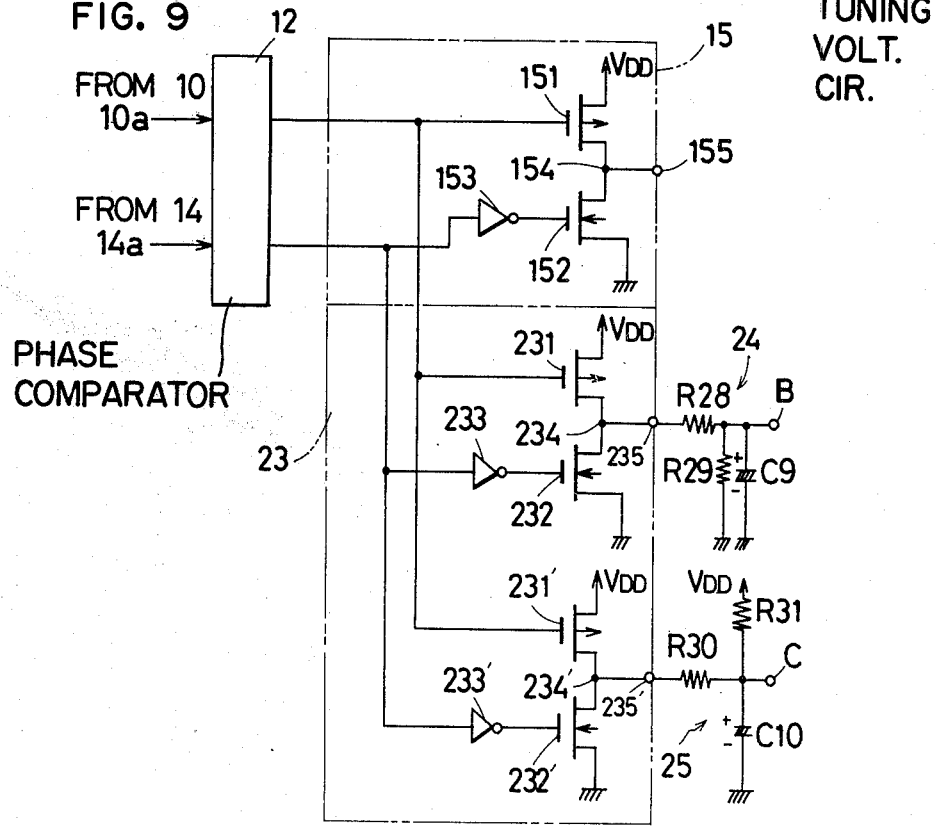

CHANNEL SELECTING APPARATUS EMPLOYING FREQUENCY SYNTHESIZER

BACKGROUND OF THE INVENTION

1. Field of the Invention

The present invention relates to a channel selecting apparatus employing a frequency synthesizer. More specifically, the present invention relates to a channel selecting apparatus, wherein the local oscillation frequency in the apparatus is frequency divided and the frequency divided output is compared with the reference frequency to provide a comparison output, which is withdrawn through a low pass filter as a tuning voltage, which is used as a signal for controlling a local oscillation frequency of the apparatus.

2. Description of the Prior Art

FIG. 1 is a block diagram showing one example of a channel selecting apparatus employing a frequency synthesizer wherein the present invention can be advantageously employed. The FIG. 1 example is shown as embodied in a television receiver. A television signal received by an antenna 2 is applied through a high frequency amplifier 3 to a mixer 5. The mixer 5 is connected to receive a local oscillation signal obtained from a local oscillator 4 including a variable capacitance diode, for example. The mixer 5 functions to mix the television signal obtained from the high frequency amplifier 3 with the local oscillation signal obtained from the local oscillator 4, thereby to provide an intermediate frequency signal by way of a beat of the television signal and the local oscillation signal. The high frequency amplifier 3, the local oscillator 4 and the mixer 5 constitute a tuner 1. The intermediate frequency signal obtained from the tuner 1 and thus from the mixer 5 is applied through an intermediate frequency amplifier 6 to a video circuit 7. The output of the video circuit 7 is applied to drive a picture tube or a cathode-ray tube 8. On the other hand, the local oscillation signal obtained from the local oscillator 4 included in the tuner 1 is frequency divided by a frequency divider or a prescaler 9 at the rate of 1/64 and the output thereof is applied to a programmable frequency divider 10. The programmable frequency divider 10 is supplied with the frequency division data obtained from a channel selector 11 as a control signal. The channel selector 11 is responsive to operation of switches corresponding to the respective channels, not shown, and an automatic scanning switch, not shown, to provide data concerning a channel being selected as a frequency division ratio of the programmable frequency divider 10. The channel selector 11 may be any one of conventional various types. The programmable frequency divider 10 frequency divides at a set frequency division ratio the signal as frequency divided by the prescaler 9, thereby to provide the output 10a to one input of a phase comparator 12. A reference oscillator 13 is provided to make oscillation at a fixed frequency of 3.58 MHz, for example, which is applied to a frequency divider 14. The frequency divider 14 is adapted to frequency divide the reference signal of the frequency 3.58 MHz, for example, at the frequency division ratio of 1/3667 to provide an output 14a, which is applied to the other input of the above described phase comparator 12. The frequency comparator 12 functions to compare the phases of the two input signals 10a and 14a and provides the output to a charge pump 15. The charge pump 15 comprises two series connected field effect transistors, as to be described subsequently, so that a capacitor, not shown, included in a low pass filter 16 is charged or discharged responsive to the output of the phase comparator 12. Thus, the low pass filter 16 serves to provide, as a tuning voltage, the voltage associated with the difference of the phases of the two signals 10a and 14a being compared by the phase comparator 12 to the variable capacitance diode included in the local oscillator 4 of the tuner 1. Although such a phase locked loop frequency synthesizer is well known to those skilled in the art, more detailed description will be made with reference to FIG. 2.

FIG. 2 shows an example in which the programmable frequency divider 10 and the associated circuit components are formed in a single integrated circuit chip 17. The integrated circuit 17 comprises an amplifier 171 for amplifying a signal obtained from the prescaler 9. The signal as aimplified by the amplifier 171 is frequency divided by a ½ frequency divider 172 and is then applied to a 13-bit programmable frequency divider 10, for example. On the other hand, the 13-bit frequency division data obtained from the channel selector 11 as shown in FIG. 1, for example, is shown as at a, b, c, and d in FIG. 2, while the control signal is shown as at e. The frequency division data concerning a channel being selected is applied to a latch circuit 173 and is also applied to latch circuits 176a and 176d. The control pulse e is applied to a load pulse generator 174. The load pulse generator 174 serves to provide a load pulse to a latch circuit 173 and AND gates 175a to 175d in order to determine the timing when the frequency division data is to be latched in the latch circuits 173 and 176a to 176d. The frequency division data and the control pulse may be obtained from a microcomputer, not shown. The latch circuit 173 is responsive to the load pulse obtained from the load pulse generator 174 to latch the frequency division data obtained from the channel selector 11, thereby to provide the output associated with the data to the AND gates 175a, 175b, 175c and 175d. The AND gates 175a to 175d are responsive to the pulse obtained from the load pulse generator 174 to provide an output, thereby to determine the latch timing of the corresponding latch circuit 176a to 176d. Thus, the latch circuits 176a to 176d latch the 13-bit frequency division data obtained from the channel selector 11, thereby to provide the same to the programmable frequency divider 10. The reference oscillator 13 including a crystal vibrator 131, externally connected to the integrated circuit chip 17, provides a signal of the reference frequency of 3.58 MHz, for example, which is applied to a frequency divider 14 having a fixed frequency division ratio of 1/3667. The output signal 10a of the programmable frequency divider 10 and the output signal 14a of the frequency divider 14 are subjected to phase comparison by means of the phase comparator 12.

FIG. 3 is a block diagram showing another example of a tuner wherein the present invention can be advantageously practiced. The FIG. 3 example is well known as a tuner of the so-called double conversion type or double superheterodyne type. The tuner of a double conversion type is disclosed in U.S. Pat. No. 3,639,840, issued Feb. 1, 1972 to Jacob Shekel et al and entitled "Multi-carrier Transmission System".

In the case where such double conversion type tuner is employed as a television tuner, a UHF television signal and VHF television signal can be received by the same circuit, while only one variable capacitance diode may be used in a tuning circuit, which is an advantage from the standpoint of cost. Furthermore, another advantage is brought about that a gain non-uniformity in the receiving band width is small, so that a noise index characteristic in the VHF band is also enhanced.

The tuner 1 comprises an attenuator 101 for attenuating a UHF and VHF television signal received by the antenna 2 in association with an automatic gain control voltage obtained from the intermediate frequency amplifier 6. The attenuator 101 employs a PIN diode, which is controlled by means of a drive circuit 107 receiving the automatic gain control voltage. The attenuator 101 is used to particularly attenuate an interference signal influencing a desired received signal and is adapted to start operating from approximately 70 db in terms of the receiving electric field strength. The output of the attenuator 101 is applied further through a wide band amplifier 102 to a first mixer 103. If desired, a band pass filter associated with a high band and low band in the VHF band and a UHF band may be switchably provided before the wide band amplifier 102. The first mixer 103 is also supplied with a local oscillation signal from a variable local oscillator 108 through a buffer amplifier 109. The variable local oscillator 108 comprises a variable capacitance diode and is adapted to make oscillation at the frequency range of approximately 2,000 to 3,000 MHz in response to the tuning voltage obtained from the phase locked loop and thus from the low pass filter 16. Accordingly, the frequency sum of the television signal and the oscillation signal obtained from the variable local oscillator 108 is evaluated by the first mixer 103 and the output thereof is applied through the intermediate frequency amplifier 104 to a second mixer 105. The second mixer 105 is further supplied with a local oscillation signal obtained from a fixed local oscillator 110 providing an oscillation signal of a constant frequency of about 2,000 MHz, for example. Accordingly, the second mixer 105 provides a beat between the output of the first mixer 103, i.e. the first intermediate frequency signal, and the local oscillation signal obtained from the fixed local oscillator 110, which output is applied to a subsequent intermediate frequency amplifier 6 as a second intermediate frequency signal, which corresponds to the output of the mixer 5 shown in FIG. 1, for example.

In the case where channel selection is made by the use of a phase locked loop frequency synthesizer in such double conversion type tuner as shown in FIG. 3, it is not advisable to apply the output of the variable local oscillator 108 as such to the prescaler 9 as shown in FIGS. 1 and 2. The reason is that the oscillation frequency of the variable local oscillator 108 is relatively high such as 2,000 to 3,000 MHz, as described previously. Therefore, in the FIG. 3 diagram, a third mixer 111 has been provided for mixing the oscillation signal of the variable local oscillator 108 with the oscillation signal of the fixed local oscillator 110, thereby to provide a signal of the frequency difference therebetween. The output of the third mixer 111 is applied to the prescaler 9. With such a structure, a problem of applying a signal of a very high frequency to the prescaler 9 is eliminated.

Such channel selecting apparatus wherein a third mixer is employed in a so-called double conversion type tuner so that the output signal of the third mixer is applied to a prescaler is disclosed in Japanese patent laying open gazette No. 105925/1978, which was filed Feb. 28, 1977 by Alps Electric Co., Ltd and layed open Sept. 14, 1978.

FIG. 4 shows a relation between the frequency f0 of the output signal from the third mixer 111 and the tuning voltage obtained from the low pass filter 16 being applied to the variable local oscillator 108 in the double conversion television tuner. A variation range of the frequency f0 ranges from 200 MHz to 0 MHz and then to 1,000 MHz with respect to the tuning voltage and, if and when the tuning voltage becomes lower than the point a (the frequency f0=0 MHz), conversely the frequency f0 increases. More specifically, a variation of the frequency f0 with respect to the tuning voltage is reversed, with the point a as a boundary. Furthermore, in the vicinity of the point b shown in FIG. 4, it could happen that the frequency variation exceeds 1,000 MHz, depending on a design of a tuner. The reason will be described in the following. More specifically, the frequency f0 of the output signal of the third mixer 110 is a difference between the frequency f1 of the oscillation signal of the variable local oscillator 108 and the frequency f2 of the oscillation signal of the fixed local oscillator 110, wherein the frequency f1 varies in the range of approximately 2,000 MHz to 3,000 MHz, whereas the frequency f2 is a fixed frequency of about 2,000 MHz. These frequencies f1 and f2 are relatively high and it is difficult to meet, within the range of the tuning voltage of 0 to 30 V, the conditions of f1>f2, f1-f2 >1,000 MHz. For example, the point a in FIG. 4 becomes the frequency f1 of 2,000 MHz when the tuning voltage is approximately 2 V, and accordingly the frequency f0 becomes zero when f1=f2=2,000 MHz. If and when the tuning voltage becomes lower than 2 V, the frequency f1 gradually decreases as compared with 2,000 MHz to reach a state wherein the frequency f1=1,800 MHz when the tuning voltage is 0 V, with the result that the frequency f0 becomes 200 MHz (=1,800 MHz 2,000 MHz). In the case where the tuning voltage is approximately 30 V, the oscillation frequency f1 of the variable local oscillator 108 exceeds 3,000 MHz, so that the frequency difference f0 from the oscillation frequency f2 of the fixed local oscillator 110 exceeds 1,000 MHz.

In case of such a characteristic of a tuner as shown in FIG. 4, wherein a varying relation between the tuning voltage and the frequency is reversed at the point a as a boundary, a so-called tuning unlocked state occurs when the tuning voltage is lower than the point a shown in FIG. 4. In the case where the output frequency of the third mixer 111, i.e. the input frequency f0 of the prescaler 9 exceeds 1,000 MHz, a tuning unlocked state likewise occurs. The reason why a tuning unlocked state occurs for the frequency f0 exceeding 1,000 MHz is that a prescaler, i.e. a frequency divider being fabricated by the current integrated circuit technology still involves a frequency region where frequency division is impossible at such a high frequency.

FIG. 5 is a graph of a tuning voltage/prescaler output frequency characteristic, wherein the ordinate indicates the output frequency of the prescaler 9 and the abscissa indicates the tuning voltage. The points a and b in FIG. 5 correspond to the points a and b in FIG. 4, respectively. The point a where the output frequency of the prescaler 9 becomes zero is determined as a designing factor of a tuner; however, in actuality the output frequency of the prescaler becomes already zero at the points c and d in FIG. 5. The reason is that the tuning voltage largely differs depending on the tuner and the same is due to a frequency characteristic of an amplifier, not shown, provided at the preceding stage of the prescaler 9. More specifically, from the standpoint of the technology and the cost, it is of a problem to make the frequency characteristic of the above described amplifier cover up to 0 MHz and, therefore, the prescaler 9 is structured not to be operable in the vicinity thereof. In the case of United States television channels, for example, Channel No. 2 is between the points c and b and is closer to the point c. Therefore, if and when the tuning voltage comes between the points c and d because of diversity of the values of various circuit components in a tuner, a temperature variation, and the like, a tuning unlocked state occurs for Channel No. 2. In particular, since the amplifier, not shown, provided at the preceding stage of the prescaler 9 is adapted to operate at a high gain, it could happen that self-oscillation occurs in the case where the input frequency is zero. In the case where self-oscillation occurs, the output of the prescaler 9 could cause a so-called free run, as shown by the dotted line g in FIG. 5. Furthermore, if a signal of a higher frequency exceeding a processing capability of the prescaler 9, i.e. exceeding 1,000 MHz, is applied, a free run as shown by the dotted line h in FIG. 5 occurs. Thus in such a free run region of the output of the prescaler 9, the above described tuning unlocked state becomes an avoidable problem.

FIG. 6 is a schematic diagram showing in detail the phase comparator 12, the charge pump 15 and the low pass filter 16. Now detailed description will be made of unlocking of a tuning state with reference to FIG. 6. The phase comparator 12 is adapted to compare the phases of the input signal 10a as frequency divided by the prescaler 9 and the frequency divider 172 (FIG. 2) and the programmable frequency divider 10 and the reference signal 14a obtained from the reference oscillator 13 through the fixed frequency divider 14. Accordingly, the outputs U and D of the phase comparator 12 both become the high level if and when the phases of the applied signals 10a and 14a coincide with each other, i.e. in case of a normal reception state, and otherwise either of the outputs U and D becomes the low level in association with the difference of the phases of the applied signals 10a and 14a. The output U of the phase comparator 12 is directly applied to the gate electrode of a P channel MOS transistor 151 included in the charge pump 15. On the other hand, the output D of the phase comparator 12 is applied through an invertor 153 to the gate electrode of an N channel MOS transistor 152. The source electrode of the P channel MOS transistor 151 is connected in series with the drain electrode of the N channel MOS transistor 152 and the drain electrode of the P channel MOS transistor 151 is connected to the voltage source $V_{DD}$, while the source electrode of the N channel MOS transistor 152 is connected to the ground. The transistor 151 or 152 is rendered non-conductive if and when the output U or D of the phase comparator 12 is the high level and is rendered conductive if and when the output U or D of the phase comparator 12 is the low level. For example, if and when the output U is the high level and the output D is the low level, the P channel MOS transistor 151 is rendered non-conductive and the N channel MOS transistor is rendered conductive. The junction 154 of these two transistors 151 and 152 of the charge pump 15 is connected through the terminal 155 to the low pass filter 16.

The low pass filter 16 comprises an intgration circuit or a smoothing circuit 161 implemented by a resistor R1 and a capacitor C1, so that the output of the charge pump 15 is smoothed by the circuit 161. At the same time, in the low pass filter 16 the terminal voltage of the capacitor C1 is supplied to the switching transistor Tr3 through the transistors Tr1 and Tr2. The transistor Tr3 serves to amplify in an inverted manner the voltage of the output of the circuit 161, thereby to provide a tuning voltage at the output point Q and thus an output line 163. The low pass filter 16 includes a negative feedback circuit 162. The negative feedback circuit 162 is constituted by capacitors C2 and C3 and a resistor R7, so that a negative feedback signal is applied to the base electrode of the transistor Tr1, thereby to remove a ripple component included in the output.

More specifically, although the charge pump 15 is controlled responsive to the output of the phase comparator 12, the output voltage becomes pulse shaped by virtue of switching between conduction and non-conduction. Since it is not preferred that the above described pulse shaped voltage is superposed on the output voltage of the low pass filter 16, such pulse shaped variation, i.e. a ripple is removed by the circuit 162. The negative feedback circuit 162 is also employed to render the so-called oscillation state of the phase locked loop in a stabilized state with promptness. For example, if a prescribed frequency division ratio is set in the programmable frequency divider 10 so as to increase the tuning frequency, for example, a phase difference occurs between the two signals 10a and 14a being applied to the phase comparator 12, so that the output D of the phase comparator 12 becomes the low level. Accordingly, the transistor 162 of the charge pump 15 is rendered conductive and the terminal voltage of the capacitor C1 constituting a time constant circuit or the smoothing circuit 161 of the low pass filter 16 decreases. The terminal voltage of the capacitor C1 is applied to the transistor Tr3 constituting an inverting amplifier through the impedance converting transistors Tr1 and Tr2. Accordingly, if and when the terminal voltage of the capacitor C1 becomes a low potential, such low potential is inverted and amplified by the transistor Tr3, so that the potential at the output point Q of the amplifier becomes high. At that time, the potential at the point Q becomes higher than a prescribed value, i.e. the voltage corresponding to a desired channel as set, which is applied to the local oscillator 4 shown in FIG. 1 or the variable local oscillator 108 shown in FIG. 3 as a tuning voltage. Then the output of the phase comparator 12 is obtained as the low level this time, so that the transistor 151 of the charge pump 15 is rendered conductive and the capacitor C1 constituting the time constant circuit or the smoothing circuit 161 is charged by the voltage source $V_{DD}$, thereby to increase the terminal voltage. The high potential of the capacitor C1 is inverted and amplified and by the transistor Tr3 and as a result the potential at the point Q becomes lower than the prescribed value, i.e. the voltage corresponding to the present channel. Thus, the tuning voltage obtained from the output point Q of the low pass filter 16 and thus from the output line 163 repeats an upward and downward variation with the tuning voltage corresponding to the desired channel as a center, thereby to ultimately converge to the voltage corresponding to the desired channel. Such repetitive variation of the tuning voltage, i.e. the oscillation of the phase locked loop requires a long period of time until a tuning locked state or a normal reception state is reached. Accordingly, the potential at the output point Q is negative feedback to the base electrode of the transistor Tr1 by means of the negative feedback circuit 162 of the low pass filter 16, whereby a ripple in the tuning voltage by virtue of the above described oscillating operation is effectively removed.

Now consider a case where the channel selector 11 is operated such that the channel is switched from Channel No. 2 in a normal reception state (a tuning locked state) to Channel No. 3. Then the frequency division ratio data corresponding to Channel No. 3 is obtained from the channel selector 11. Accordingly, the frequency division ratio of the programmable frequency divider 10 is changed from the value N2 for previous reception of Channel No. 2 to the frequency division ratio N3 corresponding to Channel No. 3. Therefore, the frequency of the output signal 10a from the programmable frequency divider 10 becomes lower than the frequency of the output signal 14a from the fixed frequency divider 14 and therefore the transistor 152 of the charge pump 15 is rendered in a conductive state for a longer period of time as compared with the transistor 151. Accordingly, the terminal voltage of the capacitor C1 included in the low pass filter 16 decreases. Meanwhile, the terminal voltage of the capacitor C1 has been stabilized at approximately a half of the source voltage $V_{DD}$ in the tuning locked state. If and when the terminal voltage of the capacitor C1 decreases as described above, the base potential of the transistor Tr1 decreases, so that the voltage at the output point Q of the transistor Tr3 increases. Accordingly, the tuning voltage obtained from the output line 163 increases, so that the oscillation frequency of the local oscillator 4 shown in FIG. 1 or the variable local oscillator 108 shown in FIG. 3 becomes the frequency corresponding to Channel No. 3. Then the phases of the two inputs 10a and 14a of the phase comparator 12 coincide with each other and as a result both of the two transistors 151 and 152 of the charge pump 15 are rendered non-conductive, whereby the capacitor C1 becomes stabilized at the terminal voltage corresponding to Channel No. 3. It goes without saying that in such situation the terminal voltage of the capacitor C1 is lower in case of reception of Channel No. 3 than in case of previous reception of Channel No. 2. Meanwhile, since even in such a stabilized state the capacitor C1 is slightly discharged, the terminal voltage accordingly decreases, thereby to cause a drift of the tuning frequency; however, the phase comparator 12, the charge pump 15 and the low pass filter 16 operates to correct such drift. Therefore, the transistors 151 and 152 are repetitively turned on and off and the drift frequency would be about 1 kHz.

As is clear, in such a structure as shown in FIG. 6, in the case where the input signal having the characteristic as shown in FIG. 5 is applied to the phase locked loop, a tuning unlocked state occurs, as described previously.

First consider a case where the prescaler 9 gives rise to such a free run as shown by the dotted line g in FIG. 5. It is assumed that in selecting Channel No. 2, for example, in such situation the tuning voltage lies between the points c and d in FIG. 5. Since the prescaler 9 is making a free run in that region, the output frequency of the prescaler 9 is higher than the frequency corresponding to Channel No. 2. Therefore, the phase comparator 12 erroneously determines that a channel of the frequency higher than that of Channel No. 2 is being received, thereby to operate to decrease the tuning voltage obtained from the low pass filter 16. Therefore, the transistor 151 of the charge pump 15 is rendered conductive considerably longer as compared with the transistor 152 and as a result the operation of the phase locked loop frequency synthesizer becomes reversed, thereby to more deviate from the normal tuning state. Ultimately, the terminal voltage of the capacitor C1 becomes stabilized at the source voltage $V_{DD}$, resulting in a tuning unlocked state.

Even if the prescaler 9 does not give rise to a free run, as shown by the dotted line g in FIG. 5, since the left side from the point d in FIG. 5 (a lower tuning voltage side) is of a reversed frequency characteristic curve, the phase comparator 12 operates to decrease the tuning voltage, if and when in receiving Channel No. 2, for example, the tuning voltage becomes lower than the tuning voltage corresponding to the point f of the frequency equal to the tuning voltage of Channel No. 2 (the voltage at the point e), with the result that an unlocked state is caused as in the above described case.

Meanwhile, in the case where the frequency f0 higher than the point b which is the upper limit of the output frequency of the prescaler 9 is applied, a tuning unlocked state results, irrespective of whether such a free run as shown as h in FIG. 5 occurs or not. Now consider a case where Channel No. 83, for example, has been selected as a chennel being received with the tuning voltage higher than the tuning voltage corresponding to the point b in FIG. 5. Then, the output frequency of the prescaler 9 becomes lower than the output frequency corresponding to Channel No. 83 by virtue of the response characteristic. Therefore, the phase comparator 12 erroneously determines that the channel lower than Channel No. 83 has been received, thereby to function to increase the tuning voltage from the low pass filter 16. Accordingly, in the charge pump 15 the conduction time period of the transistor 152 becomes considerably long as compared with that of the transistor 151 and as a reslut the terminal voltage of the capacitor C1 included in the low pass filter 16 becomes stabilized at 0 V, whereby a tuning unlocked state occurs.

The above described tuning unlocked state is conspicuously observed particularly in the so-called double conversion type tuner as shown in FIG. 3. However, such tuning unlocked state could also occur even in such a conventional tuner as shown in FIG. 1, for example, in the following situation. More specifically, such tuning unlocked state could occur in the case of a tuner for reception of the television band in Canada adapted to cover channels in VHF high band and MID band using one variable capacitance diode, or in the case of a tuner for reception of the television band in Europe adapted to cover the channels in the VHF high band and the super band by the use of one variable capacitance diode. In case of such tuners, the frequency variation range of the local oscillator 4 (FIG. 1) becomes extremely broad, as in case of the variable local oscillator 108 (FIG. 3) of a double conversion type tuner. Although the frequency range that can be covered by one variable capacitance diode is determined by a tuning capacitor connected in parallel with the variable capacitance diode, a stray capacitance of the wiring and the like, the above described variable local oscillator 108 and the local oscillator 4 both broaden the frequency range and therefore unreasonable designing is required to some extent. Thus, an attempt to cover an extremely broad frequency range by using one variable capacitance diode degrades uniformity of oscillation energy throughout the whole frequency band. Therefore, if and when even a slight deviation occurs from the frequency range at the lower limit or the upper limit or at both of them, then oscillation energy extraordinarily decrease, whereby the prescaler 9 becomes irresponsive. In such a situation, no output is obtained from the prescaler 9 and accordingly the phase locked loop does not operate and as a result a tuning unlocked state occurs. From the foregoing description, it is evident that the present invention can be applied even to a conventional tuner as shown in FIG. 1 as well as a double conversion type tuner as shown in FIG. 3.

SUMMARY OF THE INVENTION

A tuner comprises a local oscillator including a voltage controlled variable reactance device, the oscillation frequency of which local oscillator is controlled by application of a tuning voltage obtained from a phase locked loop to the voltage controlled variable reactance device. The oscillation output of the local oscillator is frequency divided by a frequency divider and the frequency divided output is applied to the phase locked loop. The local oscillator is designed such that the same makes stable oscillation at a prescribed range of the tuning voltage and the frequency divider is designed such that the same makes stable operation at a prescribed range of the input frequency. Detection is made of whether at least one of the local oscillator and the frequency divider deviates from the stable operation range and the tuning voltage obtained from the phase locked loop is corrected responsive to the detection.

According to the present invention, a channel selecting apparatus employing a frequency synthesizer is structured such that the normal operation in the stable operation range is forcibly regained by correcting the tuning voltage even when an unlocked tuning state occurs. Accordingly, a stable channel selecting operation is performed irrespective of diversity of the values of various circuit components in the tuner, fluctuation of the source voltage, or a processing capability of the frequency divider.

In a preferred embodiment of the present invention, the phase locked loop comprises a phase comparator for comparing the phases of the output signal of the above described frequency divider and a reference signal and a low pass filter for smoothing the output of the phase comparator to a direct current tuning voltage and is adapted such that upon deviation of at least one of the local oscillator and the frequency divider from the stable operation range a given voltage is added to or subtracted from the tuning voltage obtained from the low pass filter.

In a further preferred embodiment of the present invention, deviation from the stable operation range is detected by detecting whether the terminal voltage of a capacitor included in the low pass filter is stabilized to zero volt or the source voltage. In a further preferred embodiment of the present invention, a logical sum circuit for receiving the outputs of the phase comparator is provided, so that deviation of at least one of the local oscillator and the frequency divider is detected responsive to the output voltage of the logical sum circuit. In still a further preferred embodiment of the present invention, two separate charge pumps are provided in the same structure as that of the charge pump included in the phase locked loop, so that deviation from the above described stable operation range is detected based on the voltage of the integration circuit as charged or discharged by the charge pumps.

Therefore, a principal object of the present invention is to provide a channel selecting apparatus employing a frequency synthesizer which is free from a tuning unlocked state.

Another objects of the present invention is to provide a channel selecting apparatus employing a frequency synthesizer which is immune to influence of the diversified values of various circuit components of a tuner, whereby a stabilized channel selection is performed.

A further object of the present invention is to provide a channel selecting apparatus employing a frequency synthesizer, wherein a stabilized tuning operation is performed irrespective of fluctuation of the source voltage and the like.

Still a further object of the present invention is to provide a channel selecting apparatus employing a frequency synthesizer, wherein a stabilized channel selection is performed in spite of a response frequency characteristic of a prescaler or a frequency divider.

These objects and other objects, features, aspects and advantages of the present invention will become more apparent from the following detailed description when taken in conjunction with the accompanying drawings.

BRIEF DESCRIPTION OF THE DRAWINGS

FIG. 8 is a block diagram showing an outline of another embodiment of the present invention; and FIG. 9 is a schematic diagram showing a major portion of a further embodiment of the present invention.

DESCRIPTION OF THE PREFERRED EMBODIMENTS

Figure 6:
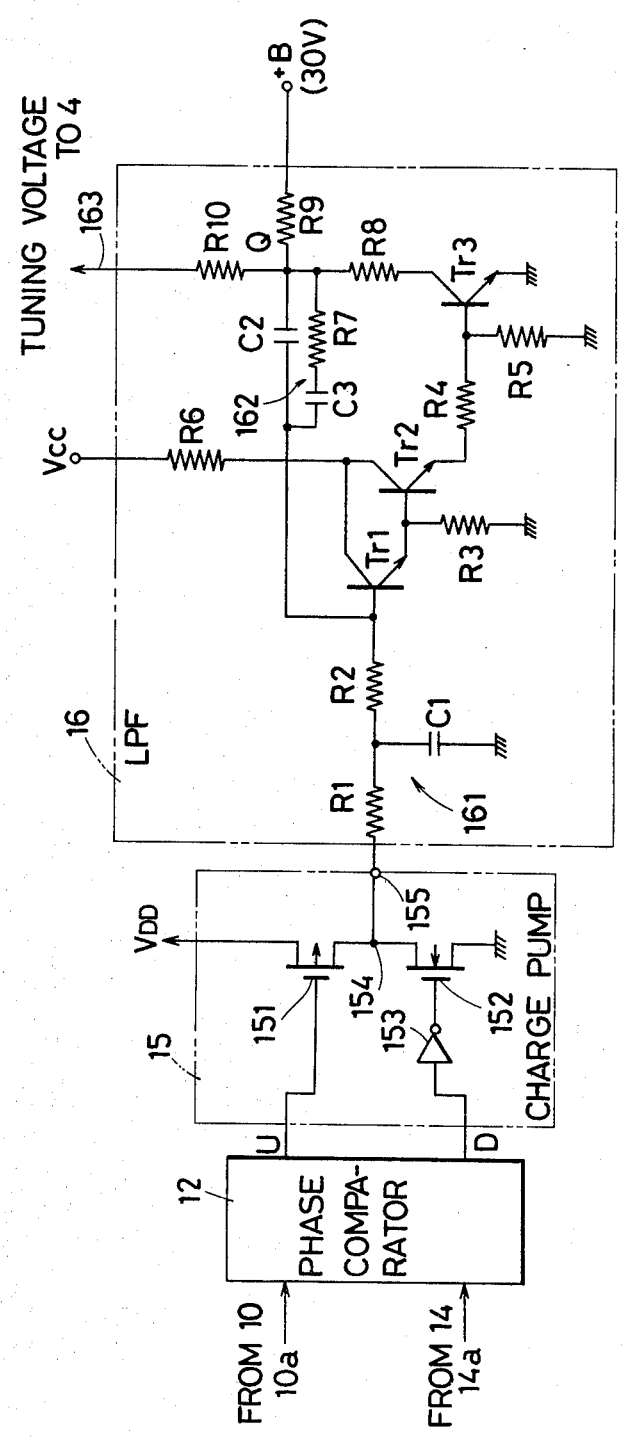
FIG. 6 is a schematic diagram showing in detail in particular a charge pump and a low pass filter of a conventional phase locked loop.
Figure 7:
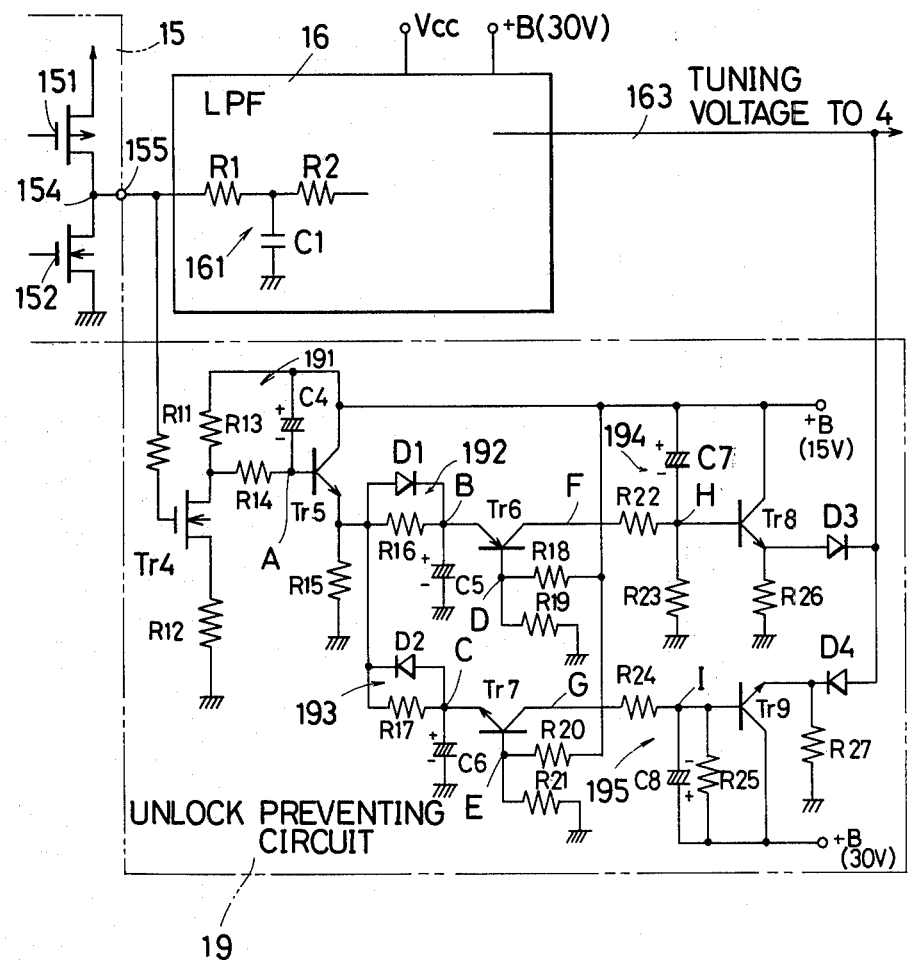
FIG. 7 is a schematic diagram of one embodiment of the present invention.

FIG. 7 is a schematic diagram of one embodiment of the present invention. Referring to FIG. 7, the charge pump 15 and the low pass filter 16 may be the same as those specifically shown in FIG. 6 and accordingly a detailed description thereof will be omitted.

Referring to an unlock preventing circuit 19 shown in FIG. 7, the transistor Tr4 comprises an N channel MOS transistor, the transistors Tr5 and Tr7 to Tr9 comprise NPN bipolar transistors, and the transistor Tr6 comprises a PNP bipolar transistor. Diodes D1 to D4 may be switching diodes. The output terminal 155 of the charge pump 15 is connected through a resistor R11 to the unlock preventing circuit 19, i.e. the gate electrode of the transistor Tr4. The resistor R11 is selected to be of an extremely large resistance value so as not to influence the charging/discharging time constant of the smoothing circuit 161 of the low pass filter 16. The transistor Tr4 functions as an impedance converter and controls a charging or discharging operation of an integration circuit or smoothing circuit 191. Although the smoothing circuit 191 makes an operation similar to the smoothing circuit 161 included in the low pass filter, the charging/discharging time constant is selected to be of a relatively small value. The transistor Tr5 is controlled responsive to the output voltage of the smoothing circuit 191. The transistor Tr5 is connected as an emitter follower and functions as a driving impedance converter for the transistors Tr6 and Tr7 of the succeeding stage. Directional charging/discharging circuits 192 and 193 are connected to the emitter electrode of the transistor Tr5. The directional charging/discharging circuit 192 functions as a circuit for driving the transistor Tr6, such that the transistor Tr6 is rendered conductive if and when the output voltage of the smoothing circuit 191 is in the increasing direction. On the other hand, the other charging/discharging circuit 193 functions as a circuit for driving the transistor Tr7, so that the transistor Tr7 is rendered conductive if and when the output voltage of the smoothing circuit 191 is in the decreasing direction. More specifically, the transistor Tr6 is rendered conductive when the emitter voltage thereof exceeds a predetermined voltage, whereas the other transistor Tr7 is rendered conductive when the emitter voltage thereof becomes lower than the predetermined voltage. Resistors R22, R23 and a capacitor C7, and resistors R24 and R25 and a capacitor C8 constitute integration circuits 194 and 195, respectively. These integration circuits 194 and 195 also perform a voltage limiting function. The transistors Tr8 and Tr9 each constitute an emitter follower, so that conduction or non-conduction of the switching diodes D3 and D4 is controlled.

Figure 1:
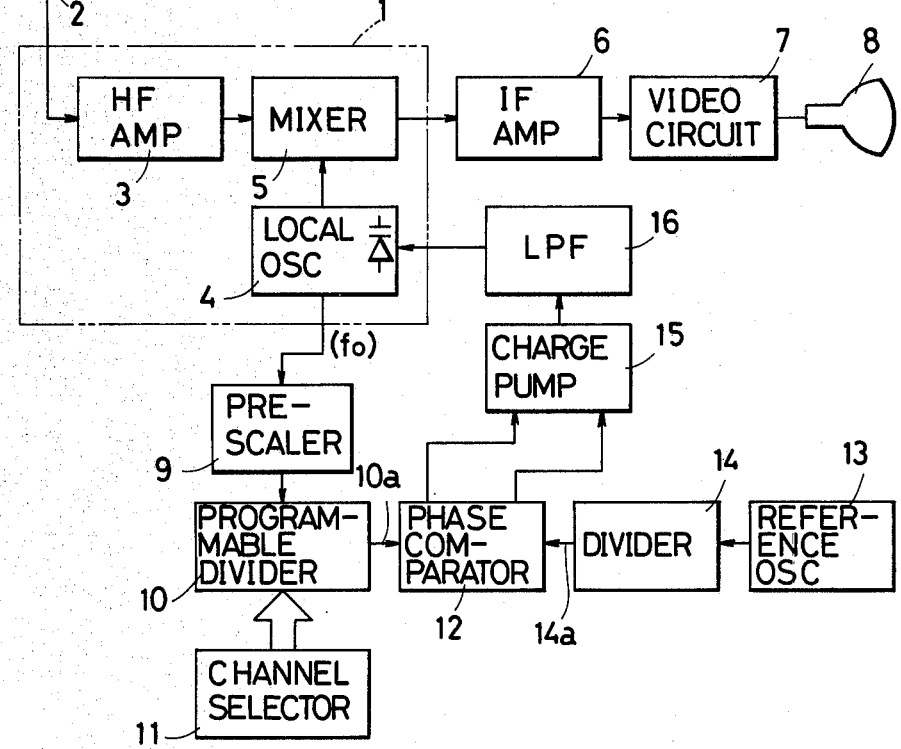
FIG. 1 is a block diagram showing one example of a conventional television tuner in which the present invention can be advantageously employed.
Figure 3:
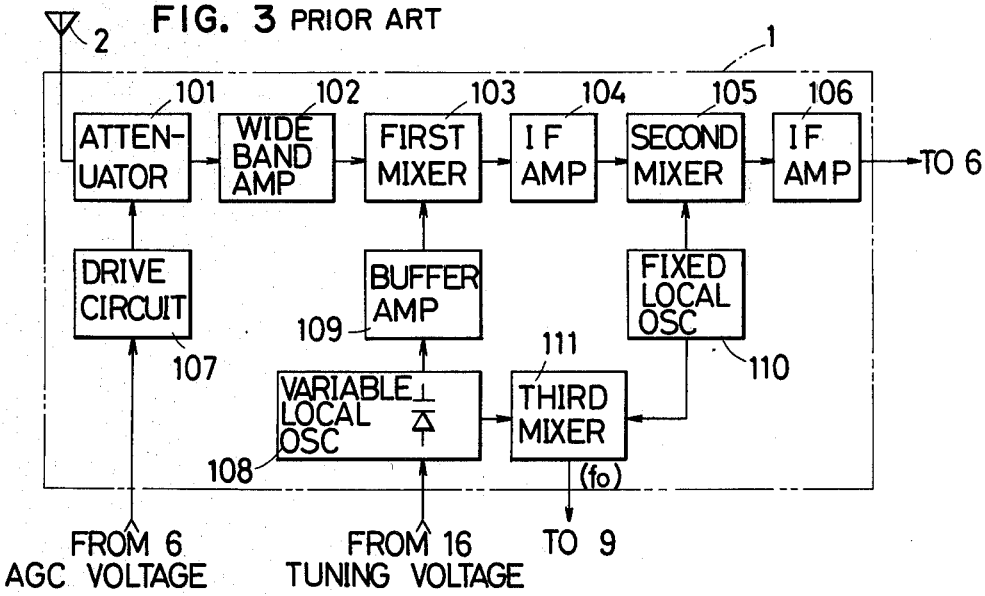
FIG. 3 is a block diagram showing a double conversion type tuner by way of another example of a conventional tuner wherein the present invention can be advantageously employed.
Figure 2:
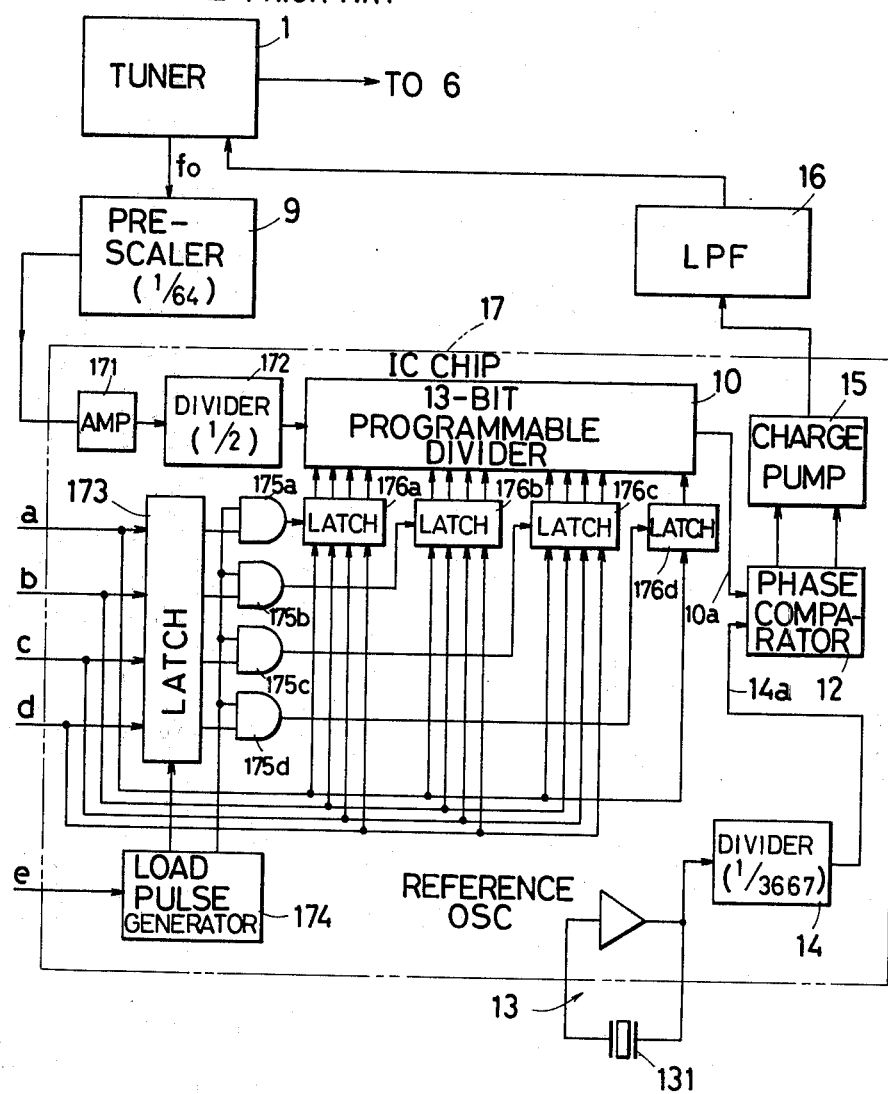
FIG. 2 is a block diagram showing in detail a portion of a phase locked loop, particularly associated with a programmable frequency divider.
Figure 4:
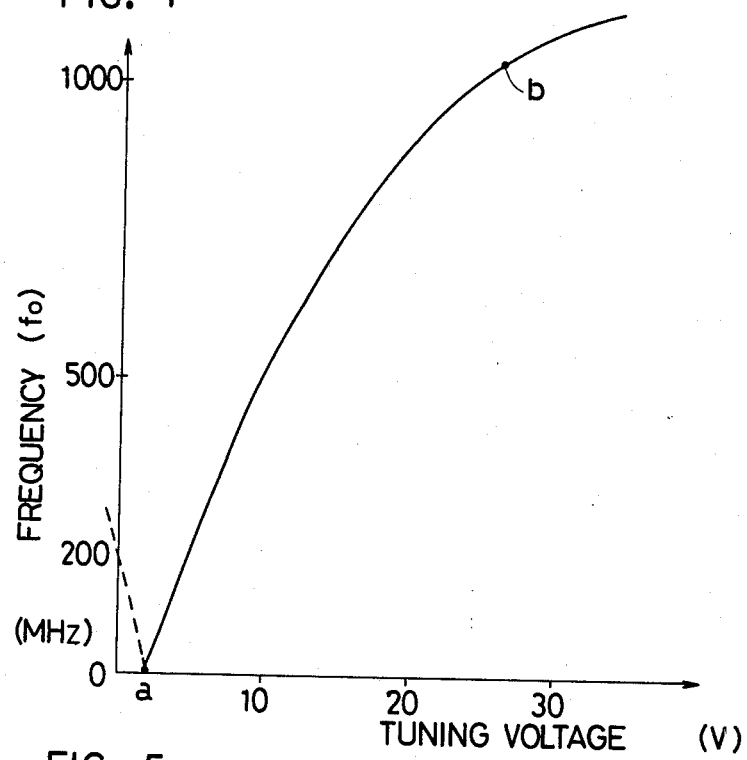
FIG. 4 shows a frequency characteristic of a variable local oscillator (a third mixer) of the FIG. 3 tuner, wherein the ordinate indicates the output frequency of the third mixer and the abscissa indicates the tuning voltage.

Now an operation of the FIG. 7 embodiment will be described with simultaneous reference to FIG. 5. First consider a case where the prescaler 9 (FIGS. 1 and 2) gives rise to a free run as shown by the dotted line g in FIG. 5. Let it be assumed that when Channel No. 2 of the United States television band, for example, is to be received using such prescaler, the tuning voltage obtained from the low pass filter 16 lies between the points c and d in FIG. 5. Then, as described previously, the terminal voltage of the capacitor C1 included in the low pass filter 16 is stabilized at the source voltage $V_{DD}$. Accordingly, the gate voltage of the transistor Tr4 of the unlock preventing circuit 19 also becomes the source voltage $V_{DD}$. The transistor Tr4 merely functions as an impedance converter and the given gate voltage as such appears at the drain electrode thereof. Accordingly, the potential at the junction A in FIG. 7 is maintained in the state close to the source voltage $V_{DD}$. As a result, the potential at the junction B of the directional charging/discharging circuit 192 also increases. If and when the voltage at the junction B, i.e. the emitter voltage of the transistor Tr6 becomes approximately 0.6 V higher than the potential at the junction D of the base electrode thereof, the transistor Tr6 is rendered conductive and the voltage at the collector electrode thereof, i.e. the voltage at the point F becomes a value closer to the voltage at the junction B. Accordingly, the voltage at the junction H of the integration circuit 194 gradually increases, so that the diode D3 becomes conductive responsive to the increasing voltage at the point H. If and when the diode D3 becomes conductive, the tuning voltage appearing at the output line 163 of the low pass filter 16 from the voltage source +B of say 15 V through the transistor Tr8 and the diode D3 is increased. Accordingly, the tuning voltage applied from the output line 163 to the local oscillator 4 (FIG. 1) or the variable local oscillator 108 (FIG. 3) is corrected to a voltage (approximately 2 V) higher than the voltage between the points c and d in FIG. 5. If the tuning voltage is thus corrected, the prescaler 9 becomes away from the free run region to shift to the normal lockable region (between the points c and b in FIG. 5), so that thereafter a desired channel, such as Channel No. 2, is tuned by virtue of a normal operation of the phase locked loop. More specifically, in the case where the tuning voltage is a voltage value corresponding to that between the points c and d shown in FIG. 5, the output frequency of the prescaler 9 is increased by virtue of a free run. However, if and when the tuning voltage is increased to exceed the point c in FIG. 5, the frequency signal so far inputted by virtue of a free run is not applied to the phase comparator 12 any more and a signal of the frequency lower than the free run frequency signal and of the frequency corresponding to Channel No. 2 is applied to the phase comparator 12, so that the tuning loop including the phase comparator 12, the charge pump 15 and the low pass filter 16 operates to increase the tuning voltage, with the result that ultimately a normal voltage corresponding to a desired channel, say Channel No. 2, is reached. Therefore, two transistors 151 and 152 of the charge pump 15 are both rendered non-conductive, thereby to establish a tuning locked state (a normal reception state). Accordingly, the potential at the junction A of the unlock preventing circuit 19 becomes approximately a half of the source voltage $V_{DD}$ as in case of the capacitor C1 of the low pass filter 16 and the voltages at the junctions B, F and H also decrease, while the switching diode D3 is turned off, with the result that an influence upon the tuning voltage appearing at the output line 163 is eliminated.

Figure 5:
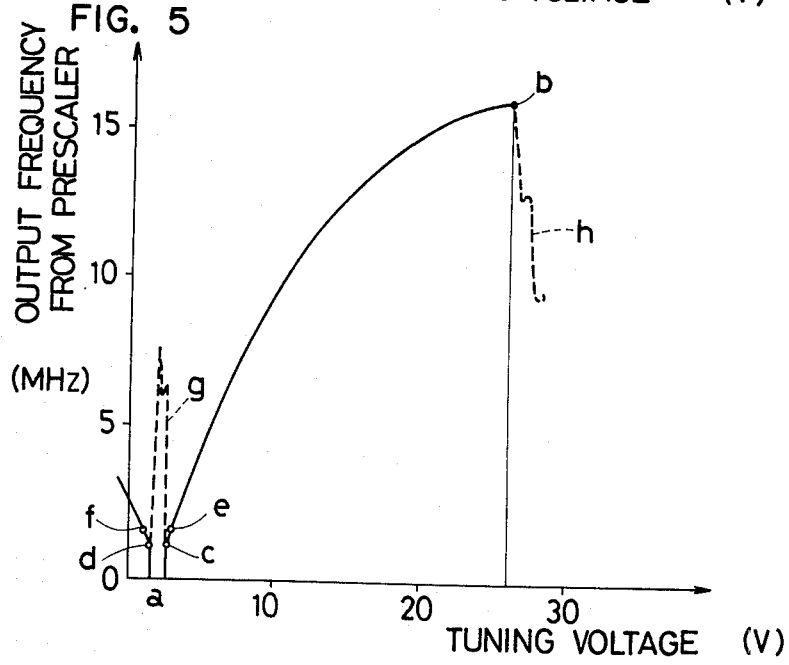
FIG. 5 shows a characteristic of the output frequency of a prescaler in the FIG. 3 tuner, wherein the ordinate indicates the output frequency and the abscissa indicates the tuning voltage.

Even in case where a tuning unlocked state is about to occur at a voltage lower than the tuning voltage corresponding to the point f shown in FIG. 5, unlocking can be effectively prevented through the same operation as the above described operation. Accordingly, even in such case, the circuit can be locked to a tuning voltage corresponding to a desired channel, say Channel No. 2 (the voltage at the point e shown in FIG. 5).

Now consider a case where the tuning voltage comes to exceed the point b shown in FIG. 5 in terms of the characteristic of the prescaler, whereby a tuning unlocked state is about to occur. In such a case, as described previously, the terminal voltage of the capacitor C1 of the low pass filter 16 becomes 0 V and therefore the voltage at the junction A of the unlock preventing circuit 19 is maintained to a value close to 0 V. Therefore, the voltage at the junction C of the directional charging/discharging circuit 193 also decreases. If and when the voltage at the junction C, i.e. at the emitter electrode of the transistor Tr7, becomes approximately 0.6 V lower than the voltage at the junction E of the base electrode thereof, the transistor Tr7 is rendered conductive. Accordingly, the voltage at the point G of the collector electrode of the transistor Tr7 decreases to be approximately equal to the voltage at the junction C. Therefore, the voltage at the junction I of the integration circuit 195 gradually decreases to render the switching diode D4 conductive. Accordingly, the tuning voltage appearing at the output line 163 of the low pass filter 16 decreases. If and when the tuning voltage becomes lower than the voltage corresponding to the point b shown in FIG. 5, this means a normal lockable region and therefore the phase locked loop normally operates, thereby to establish a normal reception state. Accordingly, the tuning voltage appearing at the output line 163 of the low pass filter 16 decreases. If and when the tuning voltage becomes lower than the voltage corresponding to the point b shown in FIG. 5, this means a normal lockable region and therefore the phase locked loop normally operates, thereby to establish a normal reception state. Accordingly, the two transistors 151 and 152 of the charge pump 15 are both rendered non-conductive, so that the potential at the junction A of the unlock preventing circuit 19 is stabilized to approximately a half of the source voltage $V_{DD}$. Accordingly, the voltages at the junctions C, G and I increase, thereby to render the diode D4 non-conductive.

FIG. 8 is a block diagram showing an outline of another embodiment of the present invention. The embodiment shown employs an integrated circuit, model MC14568, manufactured by Motorola, Inc., U.S.A., which comprises an unlock detecting circuit 20. The integrated circuit comprises a charge pump 15 of a reversed circuit configuration, as compared with the FIG. 6 diagram, such that the inverter 153' is connected to a P channel MOS transistor 151'. The charge pump 15 of the FIG. 8 embodiment is structured such that both transistors 151' and 152' are rendered non-conductive if and when the outputs U and D of the phase comparator 12 are both the low level. The unlock detecting circuit 20 comprises an NOR gate 201 connected to directly receive the outputs U and D of the phase comparator 12. The NOR gate 201 provides the high level output if and when both the outputs U and D are the low level, i.e. the input signals 10a and 14a applied to the phase comparator 12 are of the same phase, and, if and when the two signals 10a and 14a come to be out of phase, provides the low level output for a time period associated with the phase difference thereof. The output of the NOR gate 201 is applied through inverters 202 and 203 to the output terminal 204. In a conventional approach, the signal obtained from the output terminal 204 of the circuit 20 in such integrated circuit (MC14568) has been merely used to discontinue transmission of a transceiver, when an unlocked state of a phase locked loop occurs in the transceiver. However, according to the present invention, the tuning voltage obtained from the output line 163 of the low pass filter is corrected based on the voltage signal obtained from the output terminal 204. To that end, an additional circuit as shown by the two dotted line in FIG. 8 is added. More specifically, the FIG. 8 embodiment comprises an integration circuit 21 for integrating the voltage at the output terminal 204 of the unlock detecting circuit 20 and a circuit 22 for correcting the tuning voltage on the output line 163 responsive to the voltage of the integration circuit. The circuits 21 and 22 shown in FIG. 8 may employ a circuit configuration of the integration circuit 194 (or 195) and the transistor Tr8 and the diode D3 (or the transistor Tr9 and the diode D4) shown in FIG. 7, for example.

Meanwhile, according to the FIG. 8 embodiment, only one of the unlocked state in the case where the tuning voltage is lower than the point c in FIG. 5 and the unlocked state in the case where the tuning voltage is higher than the point b shown in FIG. 5 can be detected. Therefore, in employing the FIG. 8 embodiment, it is preferred or necessary to structure the prescaler 9 such that an unlocked state may not occur in the other of the case where the tuning voltage is lower than the point c in FIG. 5 and the case where the tuning voltage is higher than the point b in FIG. 5.

FIG. 9 is a schematic diagram showing a major portion of a further embodiment of the present invention. The embodiment shown comprises a circuit 23 for detecting a tuning unlocked state. The circuit 23 is similar to the FIG. 8 embodiment in that the same is implemented in one integrated circuit chip, including the charge pump 15 and the like. However, the FIG. 9 embodiment is adapted to detect both an unlocked state occurring in the case where the tuning state is lower and an unlocked state occuring in the case where the tuning state is higher. To that end, the circuit 23 comprises a pair of the circuits of the same configuration as the charge pump 15, and the output terminals 235 and 235' of them are connected to the integration circuits 24 and 25. These integrated circuits 24 and 25 are externally connected to the integrated circuit.

In case where a tuning unlocked state occurs by virtue of the tuning voltage lower than that corresponding to the point c shown in FIG. 5, for example, the output terminal B of the integration circuit 24 changes from 0 V to the source voltage $V_{DD}$, while the voltage at the output terminal C of the other integration circuit 25 is maintained at the source voltage $V_{DD}$. On the other hand, in case where a tuning unlocked state by virtue of the tuning voltage higher than that corresponding to the point b shown in FIG. 5, the output terminal B of the integration circuit 24 is maintained at 0 V, while the output terminal C of the integration circuit 25 changes from the source voltage $V_{DD}$ to 0 V. Accordingly, by connecting the output terminals B and C of the integration circuits 24 and 25 to those circuits subsequent to the junctions B and C in FIG. 7, for example, a tuning unlocked state can be effectively released in accordance with the same operation as described in conjunction with the FIG. 7 embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A channel selecting apparatus employing a frequency synthesizer, comprising:
    high frequency circuit means for receiving a high frequency input signal;
    local oscillating means having a voltage responsive variable reactance device;
    mixer means coupled to said high frequency circuit means and said local oscillator means for mixing the outputs thereof and producing an intermediate frequency signal output;
    frequency dividing means for frequency dividing the local oscillation signal obtained from said local oscillating means at a given frequency division ratio;
    programmable frequency dividing means for frequency dividing the output signal of said frequency dividing means;
    channel selecting signal means, coupled to said programmable frequency dividing means for applying a channel selecting signal thereto, wherein said programmable frequency dividing means divides the output of said frequency dividing means at a frequency division ratio in accordance with the channel selecting signal;

reference frequency signal generating means for generating a reference frequency signal;

phase comparing means for comparing the phases of the signal as frequency divided by said programmable frequency dividing means and of said reference frequency signal;

tuning voltage generating means responsive to the output of said phase comparing means for generating a tuning voltage for application to said voltage responsive variable reactance device, said tuning voltage generating means including a smoothing circuit means at the output thereof;

said local oscillating means being structured to stably operate over a predetermined range of said tuning voltage and said frequency dividing means being structured to stably operate over a predetermined frequency range of the input signal;

unlocked state detecting means responsive to the output of said phase comparing means for detecting deviation of at least one of said local oscillating means and said frequency dividing means from said stable operating range for detecting an unlocked state, wherein said unlocked state detecting means comprises:

(i) first directional charging/discharging circuit means adapted to be charged when the voltage corresponding to the output voltage of said smoothing circuit means changes in a predetermined direction;

(ii) second directional charging/discharging circuit meand adapted to be charged when the voltage corresponding to the output voltage of said smoothing circuit means changes in the direction opposite to said predetermined direction;

(iii) first voltage varying means responsive to the output of said first directional charging/discharging circuit means for varying said tuning voltage obtained from said tuning voltage generating means in an increasing direction; and (iv) second voltage varying means responsive to the output voltage of said second directional charging/discharging circuit means for varying the tuning voltage obtained from said tuning voltage generating means in a decreasing direction; and tuning voltage correcting means responsive to the output of said unlocked detecting means for correcting said tuning voltage obtained from said tuning voltage generating means for bringing at least said one of said local oscillating means and said frequency dividing means in said stable operating range.

2. A channel selecting apparatus in accordance with claim 1, wherein said unlocked state detecting means further comprises high impedance means coupled to the output of said phase comparing means, integration circuit means for integrating the output voltage obtained from said high impedance means, and switching means responsive to the output voltage of said integration circuit means for being rendered conductive/non-conductive, said first directional charging/discharging circuit means being charged when said switching means is rendered conductive and said second directional charging/discharging circuit means being charged when said switching means is rendered non-conductive.

3. A channel selecting apparatus in accordance with claim 1, wherein said first and second voltage varying means each comprise switching diodes adapted to be rendered conductive responsive to the output voltage of the corresponding directional charging/discharging circuit means, respectively, for increasing or decreasing said tuning voltage.

4. A channel selecting apparatus employing a frequency synthesizer, comprising:

high frequency circuit means for receiving a high frequency input signal;

local oscillating means having a voltage responsive variable reactance device;

mixer means coupled to said high frequency circuit means and said local oscillator means for mixing the outputs thereof and producing an intermediate frequency signal output;

frequency dividing means for frequency dividing the local oscillation signal obtained from said local oscillating means at a given frequency division ratio;

programmable frequency dividing means for frequency dividing the output signal of said frequency dividing means;

channel selecting signal means, coupled to said programmable frequency dividing means for applying a channel selecting signal thereto, wherein said programmable frequency dividing means divides the output of said frequency dividing means at a frequency division ratio in accordance with the channel selecting signal;

reference frequency signal generating means for generating a reference frequency signal;

phase comparing means for comparing the phases of the signal as frequency divided by said programmable frequency dividing means and of said reference frequency signal and for producing two outputs in response thereto;

tuning voltage generating means responsive to the output of said phase comparing means for generating a tuning voltage for application to said voltage responsive variable reactance device;

said local oscillating means being structured to stably operate over a predetermined range of said tuning voltage and said frequency dividing means being structured to stably operate over a predetermined frequency range of the input signal;

unlocked state detecting means responsive to the output of said phase comparing means for detecting deviation of at least one of said local oscillating means and said frequency dividing means from said stable operating range for detecting an unlocked state, wherein said unlocked state detecting means comprises logic circuit means for receiving the outputs of said phase comparing means and for producing a logic sum output in response thereto; and tuning voltage correcting means responsive to the output of said unlocked detecting means for correcting said tuning voltage obtained from said tuning voltage generating means for bringing at least said one of said local oscillating means and said frequency dividing means in said stable operating range wherein said tuning voltage correcting means comprises integration means for integrating the output voltage of said logic circuit means, and voltage varying means responsive to the output voltage of said integration circuit means for increasing/decreasing the tuning voltage obtained from said tuning voltage generating means.

5. A channel selecting apparatus employing a frequency synthesizer, comprising:

high frequency circuit means for receiving a high frequency input signal;

local oscillating means having a voltage responsive variable reactance device;

mixer means coupled to said high frequency circuit means and said local oscillator means for mixing the outputs thereof and producing an intermediate frequency signal output;

frequency dividing means for frequency dividing the local oscillation signal obtained from said local oscillating means at a given frequency division ratio;

programmable frequency dividing means for frequency dividing the output signal of said frequency dividing means;

channel selecting signal means, coupled to said programmable frequency dividing means for applying a channel selecting signal thereto, wherein said programmable frequency dividing means divides the output of said frequency dividing means at a frequency division ratio in accordance with the channel selecting signal;

reference frequency signal generating means for generating a reference frequency signal;

phase comparing means for comparing the phases of the signal as frequency divided by said programmable frequency dividing means and of said reference frequency signal;

tuning voltage generating means responsive to the output of said phase comparing means for generating a tuning voltage for application to said voltage responsive variable reactance device;

said local oscillating means being structured to stably operate over a predetermined range of said tuning voltage and said frequency dividing means being structured to stably operate over a predetermined frequency range of the input signal;

unlocked state detecting means responsive to the output of said phase comparing means for detecting deviation of at least one of said local oscillating means and said frequency dividing means from said stable operating range for detecting an unlocked state, wherein said unlocked state detecting means comprises:

(i) first and second charge pump means coupled to the output of said phase comparing means;

(ii) first integration circuit means for integrating the output of said first charge pump means; and (iii) second integration circuit means for integrating the output of said second charge pump means; and tuning voltage correcting means responsive to the output of said unlocked detecting means for correcting said tuning voltage obtained from said tuning voltage generating means, said tuning voltage correcting means being responsive to the output voltage of said first integration circuit means for increasing the tuning voltage obtained from said tuning voltage generating means and being responsive to the output voltage of said second integration circuit means for decreasing the tuning voltage obtained from said tuning voltage generating means for bringing at least one of said local oscillating means and said frequency dividing means in said stable operating range.

* * * * *